United States Patent [19]
Hill et al.

[11] Patent Number: 5,699,993
[45] Date of Patent: Dec. 23, 1997

[54] SEISMIC ANCHORING DEVICE FOR EQUIPMENT

[76] Inventors: Matthew Hill; N. Michele Hill, both of 5308 Vista Point Ct., Concord, Calif. 94521

[21] Appl. No.: 492,622

[22] Filed: Jun. 20, 1995

[51] Int. Cl.$^6$ .................................................. F16M 1/00
[52] U.S. Cl. ........................ 248/680; 248/316.5; 248/500
[58] Field of Search .......................... 248/680, 681, 248/500, 501, 510, 316.1, 316.5, 71, 74.1; 52/712, 714

[56] References Cited

U.S. PATENT DOCUMENTS

| | | | |
|---|---|---|---|
| 629,051 | 7/1899 | Swan | 248/74.1 X |
| 2,574,073 | 11/1951 | Vanderveld. | |
| 3,597,893 | 8/1971 | Spanel | 248/680 X |
| 4,445,255 | 5/1984 | Olejak | 248/74.1 X |
| 4,645,166 | 2/1987 | Checkley et al. | 248/510 X |
| 5,022,104 | 6/1991 | Miller. | |
| 5,330,233 | 7/1994 | Kren | 248/316.5 X |

Primary Examiner—Ramon O. Ramirez
Assistant Examiner—Anita M. King
Attorney, Agent, or Firm—Limbach & Limbach LLP

[57] ABSTRACT

A seismic anchoring system for a piece of equipment anchored on a raised floor. A seismic anchoring clip includes two members rotatably coupled together. Each member has an opening accessible from a side through an entrance. The members are rotatbly coupled together between first and closed positions. The entrances face one another when the members are in the open position so that the openings are accessible through the entrances. The openings are partially aligned and form a closed throughhole when the members are in the closed position. A support leg for the piece of equipment is positioned between the entrances when the clip is in the open position. The members are then rotated to the closed position so that the support leg is trapped in the closed throughhole.

15 Claims, 4 Drawing Sheets

5,699,993

1

SEISMIC ANCHORING DEVICE FOR EQUIPMENT

BACKGROUND OF THE INVENTION

The present invention relates to a seismic anchoring device for equipment. Unanchored or inadequately anchored equipment can slide along floors or tip over causing damage to the equipment and possibly injuring nearby workers. Seismic anchoring devices minimize earthquake related damage to equipment and minimize the risk of injury to nearby workers.

Telecommunications cabinets, for example, are particularly susceptible to earthquake related damage. Telecommunications cabinets are generally mounted on a number of support legs. The support legs generally include threaded steel rods extending from a levelling pad supported by a raised floor. The steel rods generally have a ⅜–⅝ inch diameter.

Equipment supported on steel rods are susceptible to earthquake damage since the rods have relatively low stiffness under lateral loading. The flexible support legs permit large lateral deflections which may result in support leg failure. Even if the support legs do not fail, large displacements can damage the equipment if the equipment impacts adjacent equipment. Large lateral displacements can also pull out electrical or mechanical connections rendering the equipment inoperable. Seismic anchoring devices provide lateral support for equipment to limit deflections and reduce earthquake related damage.

A conventional method of anchoring a piece of equipment is to rigidly anchor the equipment using, for example, L-shaped steel sections. One side of the L-shaped section is bolted to the floor and the other side is attached to the cabinet. The conventional method provides a rigid connection between the base of the cabinet and the floor so that the base displaces in the same manner as the floor to which it is attached.

A problem with the conventional method of anchoring equipment using L-shaped steel sections is that the rigid connections are generally permanent and, therefore, the connections cannot be easily disengaged if the equipment is moved or changed. Another problem with the conventional method is that retrofitting existing equipment installations can be somewhat cumbersome since the L-shaped sections must be physically attached to the cabinet using bolts or welds.

SUMMARY OF THE INVENTION

The present invention provides a seismic anchoring clip which is easily applied and removed thereby avoiding the problem with known seismic bracing methods. The seismic anchoring clip of the present invention preferably includes two members rotatably coupled together. Each member has an opening accessible from a side. The members are rotatably coupled together between open and closed positions. When the members are in the open position, both openings are accessible from the sides of the first and second members, respectively. When the members are rotated to the closed position, the openings are partially aligned with one another and form a closed throughhole.

The anchoring clip of the present invention is particularly useful for bracing equipment supported by the levelling pad and support rod configuration. To use the seismic anchoring clip of the present invention, the two members are moved to the open position so that both openings are accessible. The

2 clip is then fitted around the support leg with the support leg positioned between the openings. The members are then rotated to the closed position so that the support leg is trapped in the closed throughhole.

In another aspect of the invention, a split nut is provided for engaging the threaded rod supporting the equipment. The split nut is fitted around the threaded rod and the two members are fitted around the split nut. The split nut provides a close engagement with the threaded rod thereby improving the seismic anchoring of the equipment.

Other features and advantages of the invention will appear from the following description in which the preferred embodiment has been set forth in detail in conjunction with the accompanying drawings.

DESCRIPTION OF THE PREFERRED EMBODIMENTS

Figure 1:
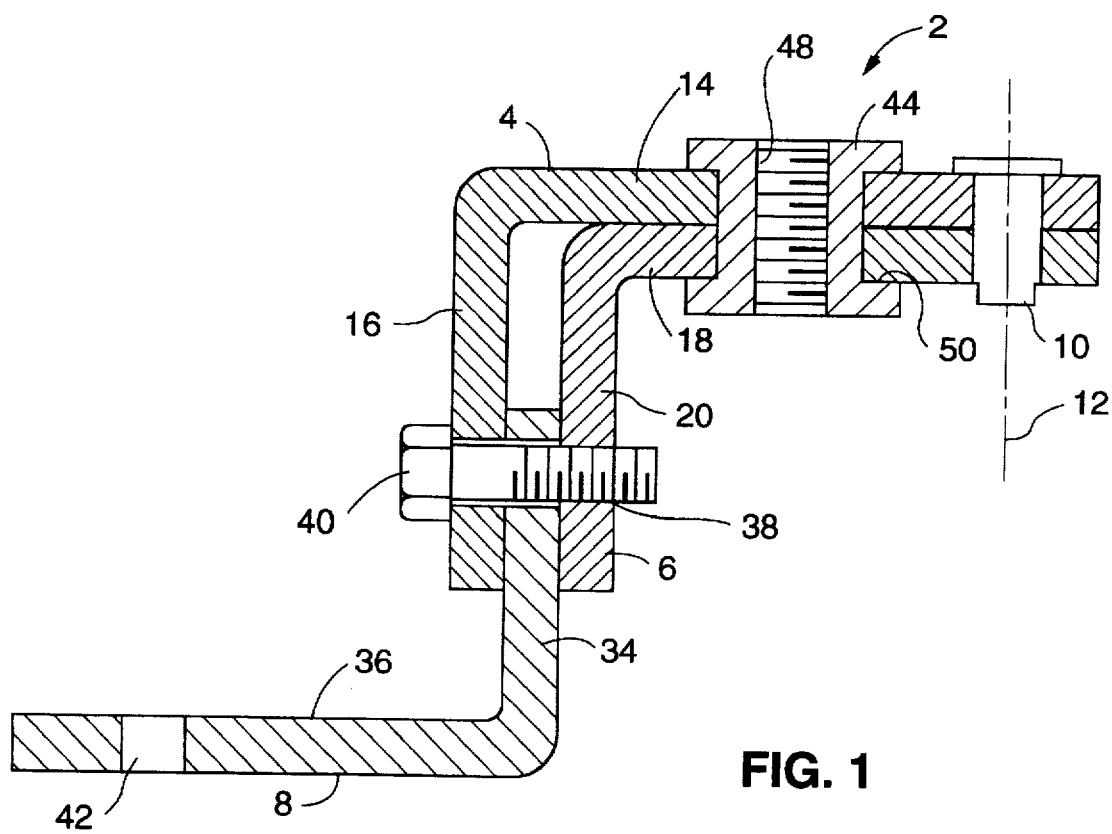
FIG. 1 is a cross-sectional view of a first embodiment of a seismic anchoring clip according to the invention.

A seismic anchoring clip 2 according to the principles of the invention is shown in FIG. 1. The seismic anchoring clip 2 includes a first member 4, a second member 6 and a third member 8. The first and second members 4, 6 are rotatably coupled together by a pin 10 for rotation about an axis of rotation 12.

Figure 2:
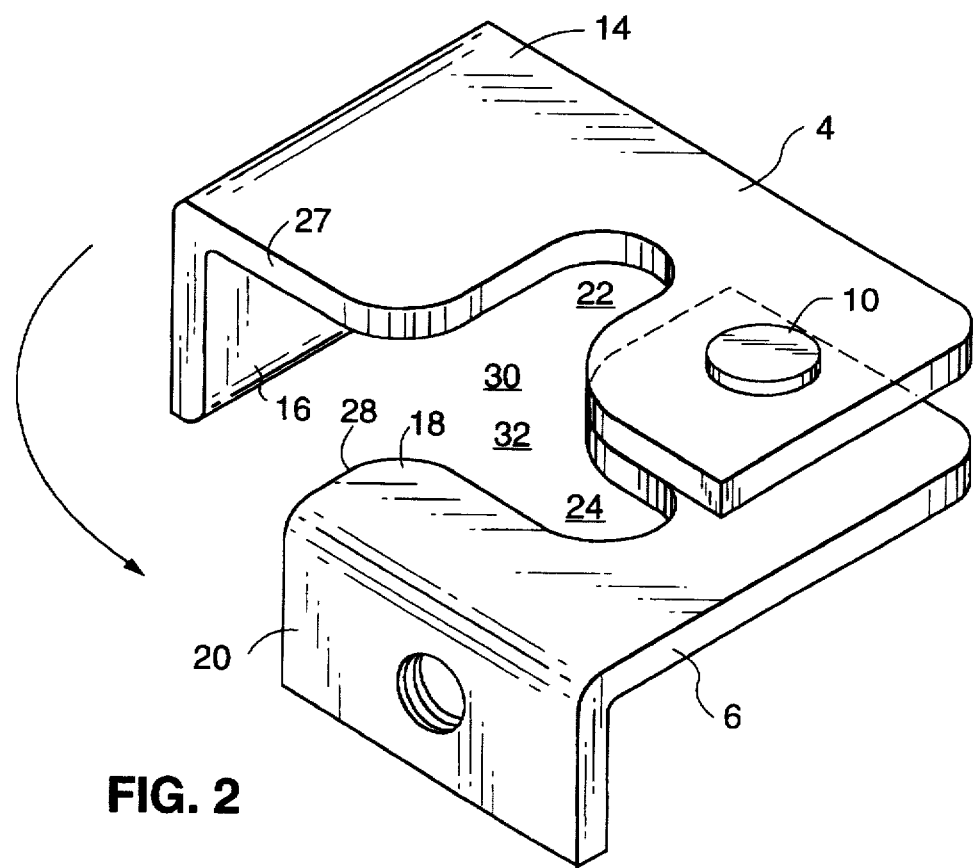
FIG. 2 is a perspective view of first and second members of the seismic anchoring clip of FIG. 1 in an open position.

Referring to FIG. 2, the first member 4 has a part 14 extending generally perpendicular to the axis of rotation 12 and a part 16 extending substantially parallel to the axis of rotation 12. The second member 6 also includes a part 18 extending generally perpendicular to the axis of rotation 12 and a part 20 extending generally parallel to the axis of rotation 12. The first and second members 4, 6 each include an opening 22, 24 accessible from a side 26, 28 of each of the first and second members 4, 6 through entrances 30, 32. The openings 22, 24 are accessible through the entrances 30, 32 in the sense that an object can enter the openings 22, 24 from a direction perpendicular to the axis of rotation 12.

Figure 3:
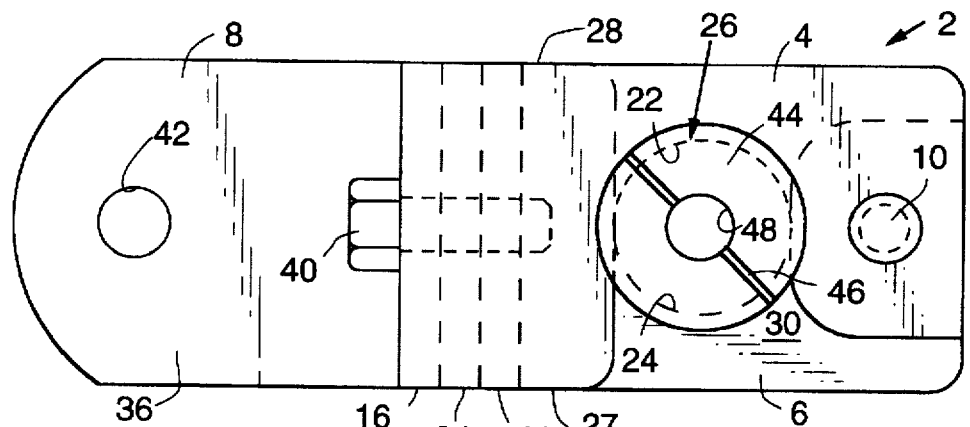
FIG. 3 is a plan view of the seismic anchoring clip of FIG. 2 with the first and second members in a closed position.

The first and second members 4, 6 are rotatably coupled to one another between an open position, which is shown in FIG. 2, and a closed position, which is shown in FIGS. 1 and 3. When the first and second members 4, 6 are in the closed position, the openings 22, 24 are partially aligned so that a closed throughhole 26 forms through the first and second members 4, 6 in the direction of the axis of rotation 12. The throughhole 26 is closed in the sense that an object extending through the closed throughhole 26 cannot escape in a direction perpendicular to the axis of rotation 12. The openings 22, 24 and entrances 30, 32 may take any other shape so long as the openings 22, 24 are accessible through the entrance 30, 32 when the first and second members 4, 6 are in the open position and so long as the closed throughhole 26 is formed when the first and second members 4, 6 are in the closed position.

The third member 8 is preferably partially positioned between the first and second members 4, 6 but may also be positioned on either side of the first and second members 4, 6. The third member 8 has a leg 34 extending substantially parallel to the axis of rotation 12 and a base 36 extending substantially perpendicular to the axis of rotation 12. A hole 38 extends through the first, second and third members 4, 6, 8 when the first and second members 4, 6 are in the closed position. A fastening device 40, such as a screw or bolt, is positioned in the hole 38 to couple the first, second and third members 4, 6, 8 together and lock the first and second members 4, 6 in the closed position. The second part 6 is preferably threaded so that the fastening device 40 engages the second part 6. Alternatively, a nut may be provided for engaging the fastening device 40. The third member 8 has a second hole 42 therethrough for anchoring the seismic anchoring clip 2 to a floor as described below.

A split nut 44 is preferably provided for engaging the support leg of the equipment. Referring to the plan view of FIG. 3, the split nut 44 is split along a radially extending split line 46. Referring again to FIG. 1, the split nut 44 has a threaded internal surface 48 for engaging a threaded support rod as will be described below in connection with use of the seismic anchoring clip 2. The split nut 44 has a recess 50 extending around the circumference of the split nut 44 which receives the first and second members 4, 6 for positively coupling the split nut 44 to the first and second members 4, 6.

Figure 4:
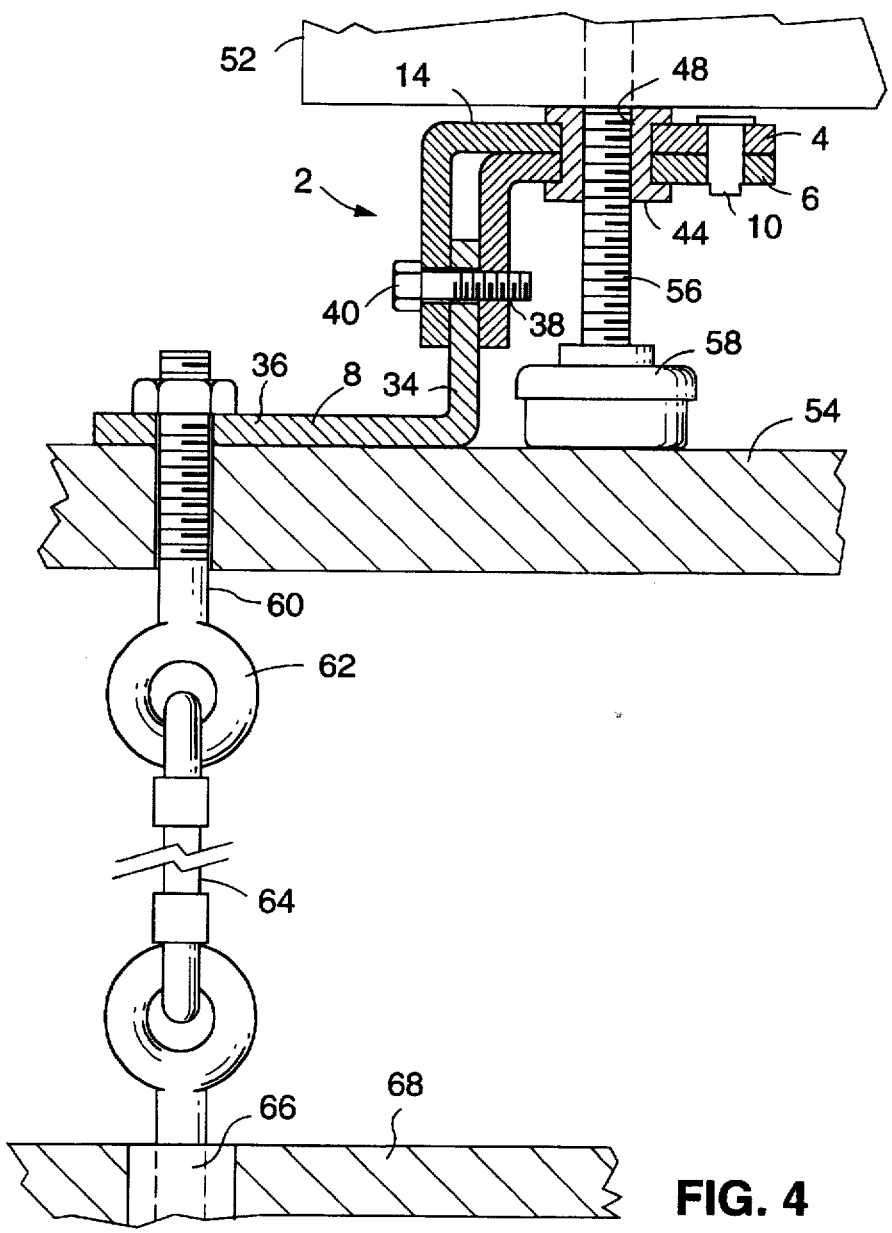
FIG. 4 is a cross-sectional view of the seismic anchoring clip of FIGS. 1 and 2 with the anchoring clip engaging a support leg of a piece of equipment.

Referring to FIG. 4, the seismic anchoring clip 2 of the present invention is particularly useful for anchoring a piece of equipment 52 which is supported on a floor 54 and, in particular, a raised floor. Raised floor systems are often used in electrical equipment rooms, such as telecommunications equipment rooms. The equipment, for example, a telecommunication cabinet, is supported by a threaded support leg 56 attached to a levelling pad 58. The split nut 44 is fitted around the support leg 56 near the equipment 52 and preferably in contact with the equipment 52. It is preferable to position the split nut 44 as near to the equipment 52 as possible to minimize deflections of the equipment 52.

The first and second members 4, 6 are then moved to the open position of FIG. 2 and positioned around the split nut 44 so that the support leg 56 is positioned between the openings 22, 24 in the first and second members 4, 6. The first and second members 4, 6 are then rotated to the closed position of FIG. 1 thereby trapping the split nut 44 and support leg 56 in the closed throughhole 26. The fastening device 40 is then positioned in the hole and tightened to lock the first and second members 4, 6 in the closed position.

The third member 8 is then coupled to the raised floor with a second fastening device 60 through the second hole 42. The fastening device 60 is preferably a bolt having an eye 62. A tensioned cable 64 extends between the fastening device 60 and an anchor bolt 66 embedded in a concrete floor 68. The anchor bolt is preferably a ½"×2" threaded insert and the cable 64 is preferably a 3/16" stranded cable having a pair of ferrules. A nut (not shown) is tightened to tension the cable 64. Although it is preferred to use the cable 64 to couple the bolt and anchor bolt 66, the bolt may also extend to the concrete floor 68 or may be coupled to the anchor bolt 66 with threaded rods and turnbuckles rather than with the cable 64 and ferrules. When the equipment is anchored at four corners, the cable 64 preferably extends 45° outwardly and away from the corner of the equipment so that the cables 64 exert opposing, tensile forces on the equipment.

The third member 8 advantageously provides flexibility in that the distance between the hole 38 and the base 36 can be varied by selecting a third member 8 having the desired dimensions. Thus, after the first and second members 4, 6 are fitted to the support leg 56 with the split nut 44 engaging the top of the support leg 56, an appropriately sized third member 8 can be selected. Even if the distance between the bottom of the equipment and the floor varies, the seismic anchoring clip 2 provides flexibility if varying sizes of the third member 8 are provided.

A clear advantage of the present invention is that it may be used as a seismic retrofit of existing equipment installations and can be fitted quickly and easily. Furthermore, as described above, the third member provides flexibility so that the split nut can be positioned near the equipment to provide a rigid system.

Figure 5:
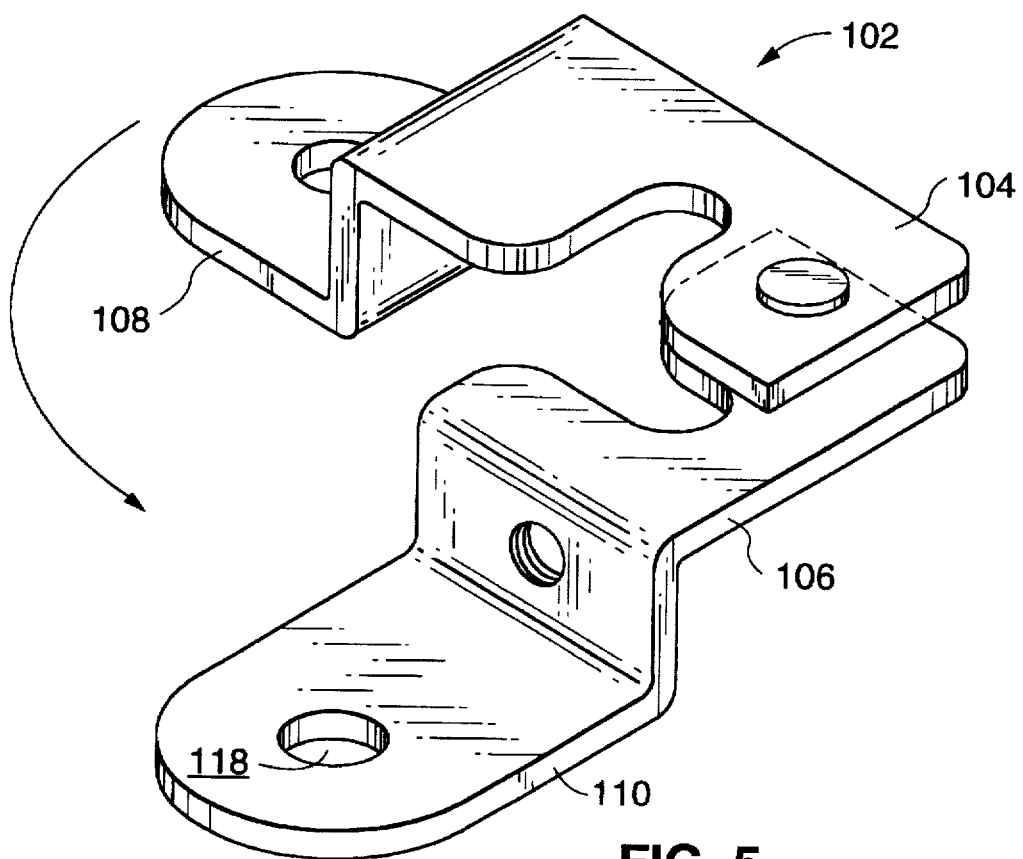
FIG. 5 is a perspective view of a second embodiment seismic anchoring clip according to the principles of the invention with the first and second members being in the open position.
Figure 6:
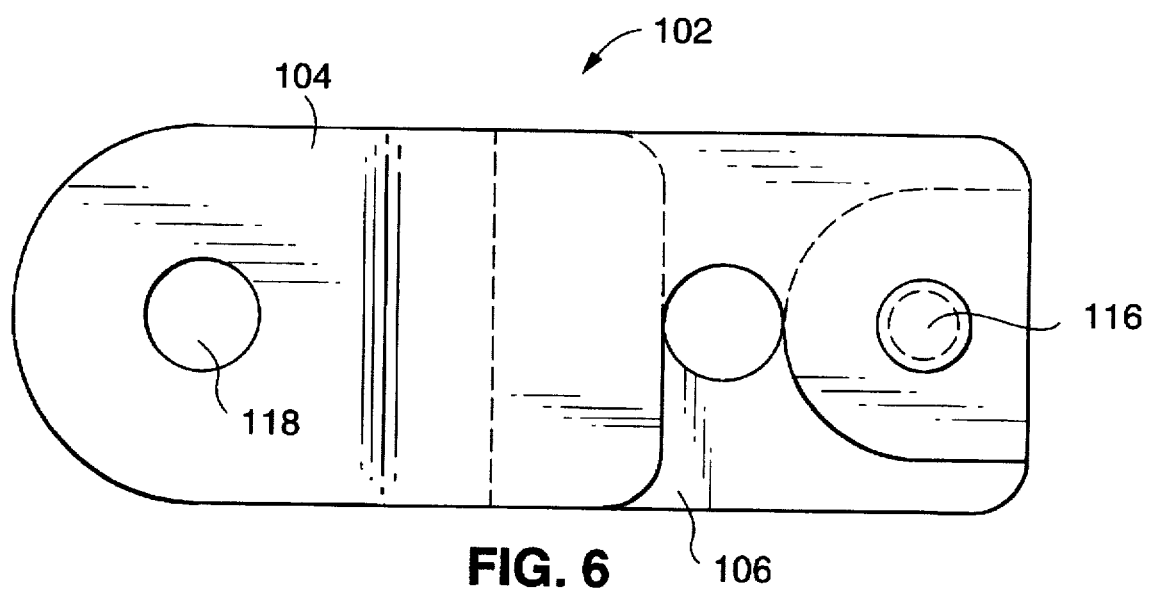
FIG. 6 is a plan view of the seismic anchoring clip of FIG. 5 with the first and second members in the closed position.

Referring to FIGS. 5 and 6, a second preferred seismic anchoring clip 102 is shown. The second preferred seismic anchoring clip 102 also includes a first member 104 and a second member 106 but does not include the third member 8 described above. The first and second members 104, 106 are the same as the first and second members 4, 6 of the first preferred seismic anchoring clip 2 except that the first and second members 104, 106 include base extensions 108, 110 extending perpendicular to the axis of rotation 116. A third hole 118 extends through the base extensions 108, 110 for locking the first and second members 104, 106 in the closed position and for coupling the seismic anchor clip 102 to a floor. The second preferred seismic anchoring clip 102 is also preferably used with the split nut 44 described above. Use of the second preferred seismic anchoring clip 102 is generally the same as the method described above in connection with the first seismic anchoring clip 2. The first, preferred seismic anchoring clip 2 is preferred since the third member 8 gives the first preferred seismic anchoring clip 2 flexibility as described above. The second, preferred seismic anchoring clip 102 is useful when the distance between the equipment and the floor leg does not vary.

Figure 7:
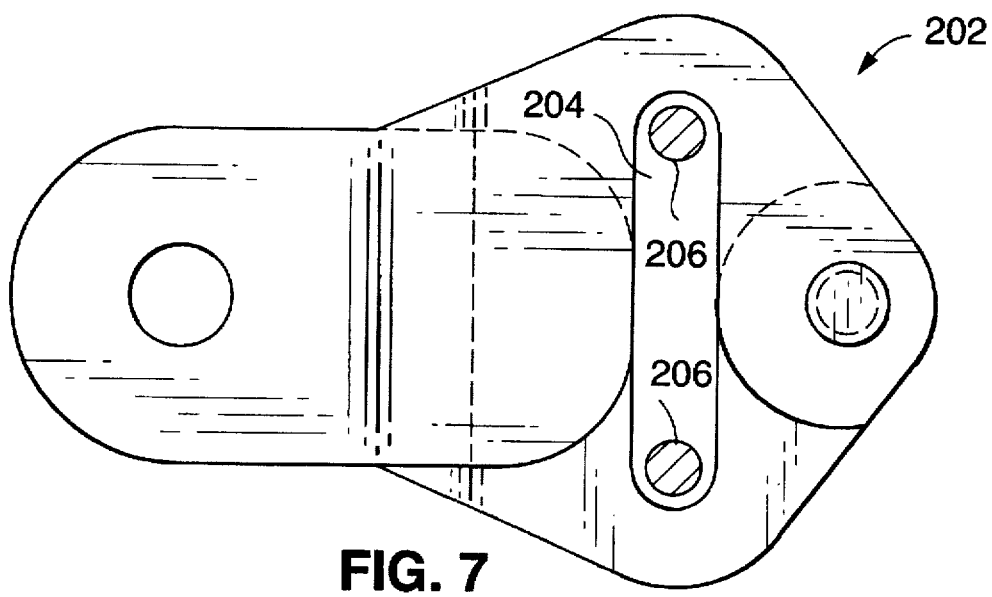
FIG. 7 is a plan view of a third embodiment of the seismic anchoring clip with the first and second members in the closed position.
Figure 8:
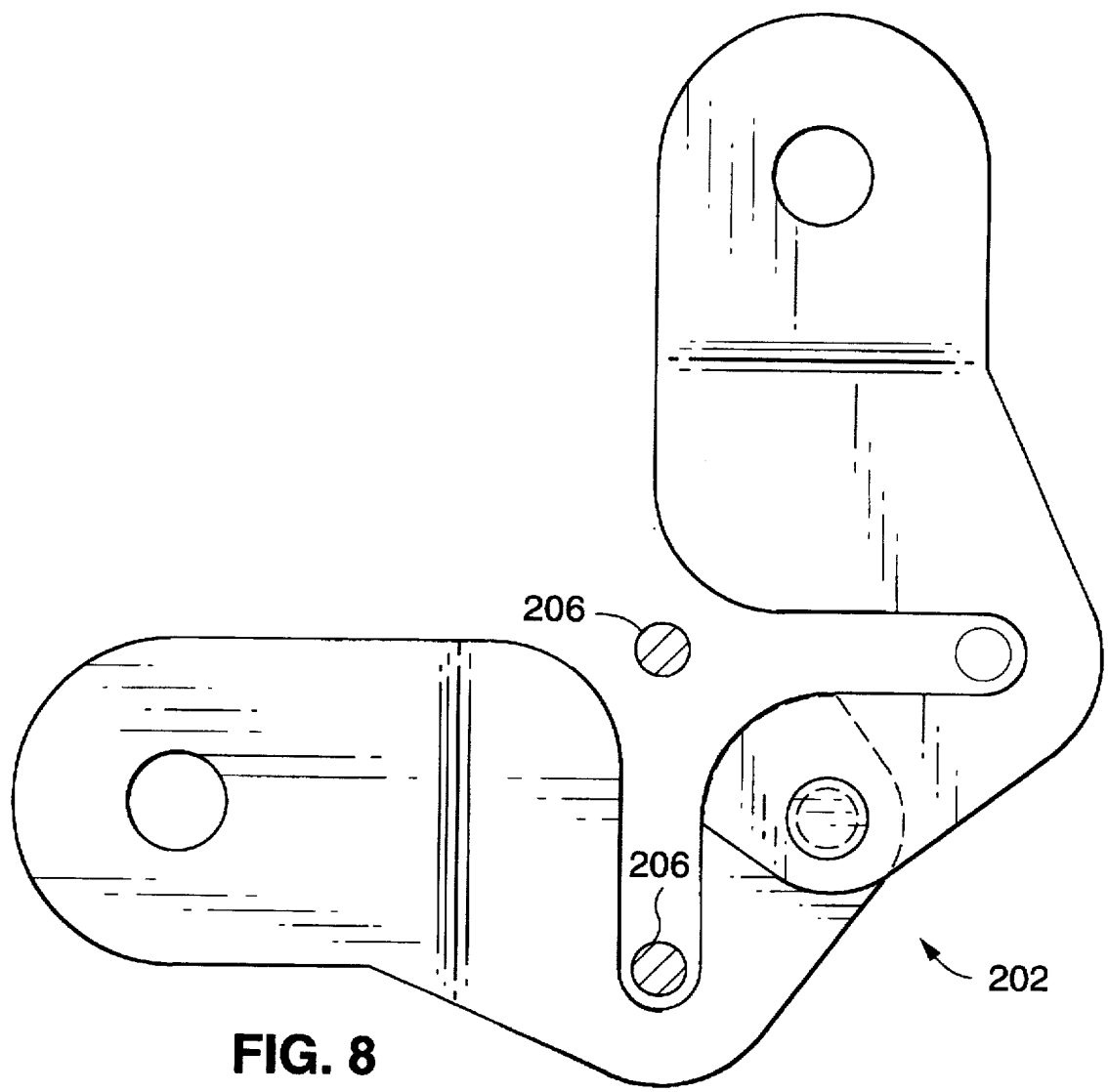
FIG. 8 is a plan view of the third embodiment of the seismic anchoring clip with the first and second members the open position.

Referring to FIGS. 7 and 8, a third preferred seismic anchoring clip 202 is shown. The third preferred seismic anchoring clip 202 has an elongate slot-shaped throughhole 204 which is sized to trap two support legs 206 for adjacent equipment. An advantage of the third preferred seismic anchoring clip 202 is a reduction in labor requirements since only one clip is required for two support legs 106. A further advantage of the seismic anchoring clip 202 is that adjacent equipment may be tied together thereby reducing the likelihood that adjacent equipment will bang into each other during an earthquake.

Modification and variation can be made to the disclosed embodiments without departing from the subject of the invention as defined by the following claims. For example, the seismic anchoring clip can be used without the split nut 44, the seismic anchoring clip can fitted around the base of the support legs rather than at the top of the support legs, and the seismic anchoring clip can directly connected to a concrete floor rather than a raised floor.

We claim:

1. A method for anchoring and providing lateral support for the upright leg of a piece of equipment supported on a floor, comprising the steps of:

provinding an anchoring clip having a first member and a second member, the first member including a first opening accessible from a side through a first entrance, the second member having a second opening accessible from a side through a second entrance, the first and second members being rotatably coupled together about an axis of rotation for movement between an open condition and a closed condition, the first and second openings being accessible through the first and second entrances, respectively, when the first and second members are in the open condition, the first and second openings being partially aligned with one another and forming a closed throughhole through the first and second members when the first and second members are in the closed condition, the closed throughhole having an axis extending in the direction of the axis of rotation;

positioning the upright support leg of the piece of equipment between the first and second openings when the first and second members are in the open condition;

moving the first and second members to the closed condition after the positioning step thereby trapping the support leg in the closed throughhole;

locking the first and second members in the closed condition; and, securing the anchoring clip to the floor with the first and second members locked in the closed condition and the axis of the throughhole disposed upright relative to the floor to laterally support the leg in an upright condition.

2. The method according to claim 1, wherein:

the first and second members have holes extending therethrough which assume aligned condition when the members are in the closed condition.

3. The method according to claim 2, wherein:

the locking step is carried out by inserting a fastening device through the aligned holes in the first and second members.

4. The method according to claim 3, further comprising the step of:

positioning a split nut around the support leg before the moving step; and, wherein the moving step traps the split nut in the closed throughhole.

5. The method according to claim 2, further comprising the step of:

positioning a third member in contact with at least one of the first and second members, said third member having a hole passing therethrough; and wherein the locking step is carried out by passing a fastening device through the the holes in the first, second and third members to lock the members together.

6. A seismic anchoring clip to anchor and provide lateral support for an upright leg of a piece of equipment supported on a floor, said clip comprising:

a first plate member having a first leg engaging portion with a first opening extending therethrough and accessible through one side thereof, whereby the leg of the piece of equipment may be introduced into the first opening, and a first spacing portion extending at ah angle with respect to the leg engaging portion;

a second plate member having a second leg engaging portion with a second opening extending therethrough and accessible through one side thereof, whereby the leg of the piece of equipment may be introduced into the second opening, and a second spacing portion extending at an angle with respect to the leg engaging portion;

means coupling the leg engaging portions of the first and second plate members together in overlapping relationship whereby the members may be rotated between an open condition in which the openings in the leg engaging portions of the plate members are accessible and the spacing portions of the plate members are angularly displaced relative to one another and a closed condition in which the openings are partially aligned to form a closed throughhole having an axis extending through the leg engaging portions of the first and second plate members and the spacing portions are generally angularly aligned; and, means to secure the spacing portions of the first and second plate members to the floor when aligned to maintain the leg engaging portions in spaced relationship to the floor with the axis of the throughhole disposed upright relative to the floor.

7. The seismic anchoring clip according to claim 6, further comprising:

a fastening device;

a first hole and a second hole extending through the first and second plate members, respectively when the first and second plate members are in the closed condition;

the fastening device extending through the holes in the first and second plate members and locking the first and second plate members in the closed condition.

8. The seismic anchoring clip according to claim 7, further comprising:

a third plate member, a third hole passing through the third plate member;

the fastening device extending through the holes in the first, second and third plate members when the first and second members are in the closed condition.

9. The seismic anchoring clip according to claim 8, wherein:

the third plate member is at least partially positioned between the first and second plate members.

10. The seismic anchoring clip according to claim 8, further comprising:

an anchor adapted to be anchored to a concrete floor; and a cable connected to the anchor, the cable being coupled to the third plate member.

11. A seismic anchoring clip according to claim 6 wherein the leg engaging and spacing portions of the plate members extend at generally right angled relationship to one another.

12. A seismic anchoring clip according to claim 6, wherein:

a first anchoring portion forming part of the first plate member extends from the first spacing portion thereof in spaced generally parallel relationship to the first leg engaging portion thereof;

a second anchoring portion forming part of the second plate member extends from the spacing portion thereof in spaced generally parallel relationship to the second leg engaging portion thereof; and, the anchoring portions of the first and second plate members overlap when the first and second plate members are in the closed condition and comprise the means to secure the spacing portions of the first and second plate members to the floor.

13. A seismic anchoring clip according to claim 12 wherein the means to secure further comprises openings formed in the anchoring portions of the first and second plate members for alignment when the plate members are in the closed condition.

14. A seismic anchoring clip according to claim 6 further comprising a split nut receivable in the openings in the leg engaging portions of the first and second plate members for engagement with the leg of said piece of equipment received within the openings.

15. A seismic anchoring clip according to claim 14 wherein the split nut has threads configured to engage threads on the leg of said piece of equipment received within the openings in the leg portions of the first and second plate members.

* * * * *